(12) United States Patent
Qian

(10) Patent No.: US 11,690,196 B2
(45) Date of Patent: Jun. 27, 2023

(54) FAN FRAME STRUCTURE

(71) Applicant: ASIA VITAL COMPONENTS (CHINA) CO., LTD., Shenzhen (CN)

(72) Inventor: Jin Qian, Shenzhen (CN)

(73) Assignee: Asia Vital Components (China) Co., Ltd., Shenzhen (CN)

( * ) Notice: Subject to any disclaimer, the term of this patent is extended or adjusted under 35 U.S.C. 154(b) by 0 days.

(21) Appl. No.: 17/385,916

(22) Filed: Jul. 27, 2021

(65) Prior Publication Data

US 2023/0007810 A1    Jan. 5, 2023

(30) Foreign Application Priority Data

Jul. 2, 2021    (CN) ......................... 202110749715.7

(51) Int. Cl.
H05K 7/20    (2006.01)

(52) U.S. Cl.
CPC .................................. H05K 7/20172 (2013.01)

(58) Field of Classification Search
CPC ............ H05K 7/20172; F04D 29/4226; F04D 26/4226
See application file for complete search history.

(56) References Cited

U.S. PATENT DOCUMENTS

| | | | | |
|---|---|---|---|---|
| 2005/0002808 A1* | 1/2005 | Huang | ................. | F04D 25/0606 417/423.15 |
| 2005/0105271 A1* | 5/2005 | Lu | ...................... | H05K 7/20172 415/213.1 |
| 2005/0207888 A1* | 9/2005 | Kashiwazaki | ...... | F04D 29/4226 415/206 |
| 2009/0060730 A1* | 3/2009 | Hwang | ................... | F04D 29/30 415/203 |
| 2009/0169377 A1* | 7/2009 | Horng | ................... | F04D 29/646 415/213.1 |
| 2009/0230798 A1* | 9/2009 | Ho | ........................... | H02K 5/08 310/89 |
| 2012/0087790 A1* | 4/2012 | Zeng | ................... | F04D 25/0613 415/213.1 |

(Continued)

FOREIGN PATENT DOCUMENTS

| | | |
|---|---|---|
| CN | 201574978 U | 9/2010 |
| CN | 103727066 A | 4/2014 |

(Continued)

OTHER PUBLICATIONS

Search Report dated Mar. 31, 2022 issued by Taiwan Intellectual Property Office for counterpart application No. 110124470.

*Primary Examiner* — Stephen S Sul
(74) *Attorney, Agent, or Firm* — Brad J. Thorson; DeWitt LLP

(57) ABSTRACT

A fan frame structure includes a base portion and a wall portion. The base portion has at least one extension section vertically extended from an outer peripheral edge of the base portion, and the extension section has connecting sides. The wall portion is formed along the outer peripheral edge of the base portion through an insert molding process. The wall portion includes a plurality of wall segments connected to the connecting sides of the extension sections, and a clearance is formed between any two adjacent wall segments. With these arrangements, the base portion can better resist a wrapping force from the insert-molded wall portion to avoid deformation.

8 Claims, 3 Drawing Sheets

(56) References Cited

U.S. PATENT DOCUMENTS

| | | | | |
|---|---|---|---|---|
| 2012/0156022 | A1* | 6/2012 | Otsuki | F04D 25/0613 |
| | | | | 415/203 |
| 2013/0121830 | A1* | 5/2013 | Lee | F04D 29/646 |
| | | | | 29/889.6 |
| 2014/0178184 | A1* | 6/2014 | Chou | H02K 5/1677 |
| | | | | 165/80.1 |
| 2015/0198176 | A1* | 7/2015 | Tamaoka | F04D 29/4226 |
| | | | | 361/679.49 |
| 2015/0275906 | A1* | 10/2015 | Yeh | H05K 3/182 |
| | | | | 29/842 |
| 2017/0107994 | A1* | 4/2017 | Kosaka | F04D 25/0613 |
| 2020/0245498 | A1* | 7/2020 | Wu | H05K 7/20154 |
| 2021/0071682 | A1* | 3/2021 | Yang | F04D 29/281 |
| 2021/0216120 | A1* | 7/2021 | Kitamura | H05K 7/20145 |
| 2021/0317844 | A1* | 10/2021 | Chen | F04D 29/281 |
| 2021/0321533 | A1* | 10/2021 | Chen | F04D 29/281 |

FOREIGN PATENT DOCUMENTS

| | | |
|---|---|---|
| TW | 200925842 A | 6/2009 |
| TW | M617128 | 9/2021 |

* cited by examiner

FAN FRAME STRUCTURE

This application claims the priority benefit of China patent application number 202110749715.7 filed on Jul. 2, 2021.

FIELD OF THE INVENTION

The present invention relates to a fan frame structure, and more particularly to a fan frame structure that has increased capability of resisting a wrapping force applied by an insert-molded wall portion to a base portion of the fan frame, so as to reduce deformation of the base portion of the fan frame base under the wrapping force.

BACKGROUND OF THE INVENTION

A centrifugal fan is a very popular systematic fan and is often applied to an electronic device having a narrow internal space or to an occasion that has to provide an air outlet at a lateral side thereof. Generally, the centrifugal fan has a base made of one single type of plastic material or a thin metal plate. In the case of using a plastic base, it is manufactured through a plastic injection molding process. However, since the plastic base has inferior structural strength, the thin metal plate is usually selected as the material for forming the fan base. Thereafter, a vertical side wall is formed along an outer peripheral edge of the metal base by way of an overmolding process to complete the centrifugal fan frame.

As mentioned above, the widely applied centrifugal fan frame generally includes a metal base and a plastic side wall. Usually, the centrifugal fan frame is formed by overmolding the metal base with a plastic molding material. Since the overmolding plastic material tends to produce a wrapping force after the material is molded, and the metal base subjected to the wrapping force tends to be pressed and deformed. In the subsequent assembling process, the deformed base would affect the designed clearance size, horizontality and balance between the fan blades and the base of the finished product of fan. In a worse condition, the fan performance is also affected due to interference of the fan blades with the base, changes in the relationship between the static pressure (P) and air flow rate (Q) of the fan, changes in produced noise, etc.

It is therefore desirable to improve the problem of a deformed metal base caused by the insert molded side wall of the centrifugal fan frame.

SUMMARY OF THE INVENTION

To effectively solve the above problem, a primary object of the present invention is to provide an improved fan frame structure that can overcome the disadvantage of the conventional injection molded centrifugal fan frame side wall, which tends to cause deformation of the metal base of the fan frame.

To achieve the above and other objects, the fan frame structure according to the present invention includes a base portion and a wall portion.

The base portion includes at least one extension section vertically extended from an outer peripheral edge of the base portion, and the extension section has connecting sides. The wall portion is formed along the outer peripheral edge of the base portion through insert molding and includes a plurality of wall segments. The wall segments are respectively connected to the connecting sides of the extension sections, and a clearance is formed between any two adjacent wall segments. With these arrangements, the fan frame structure has increased capability of resisting a wrapping force applied by the insert molded wall portion to the base portion and preventing the base portion from deformation under the wrapping force.

In the fan frame structure of the present invention, since the wall segments are connected to the extension sections in the insert molding process with a clearance reserved between any two adjacent wall segments to provide sufficient expansion allowance for the wall segments, it is able to prevent any expansion of the insert molded wall portion to press against the base portion and deform the latter.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
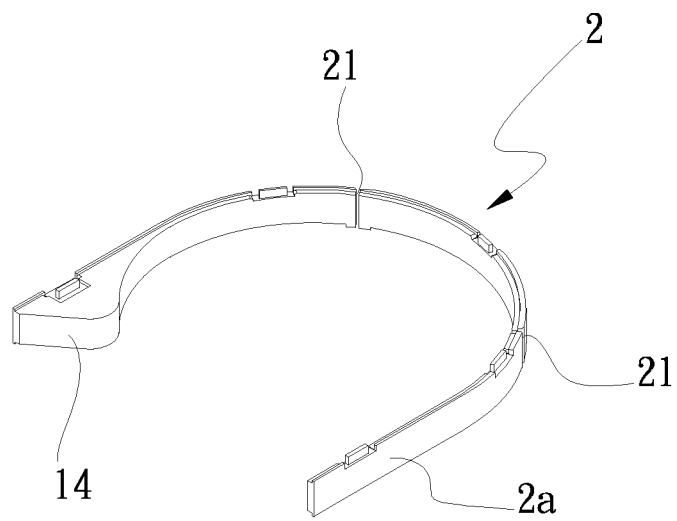
FIG. 1 is an exploded perspective view of a fan frame structure according to a preferred embodiment of the present invention.
Figure 1:
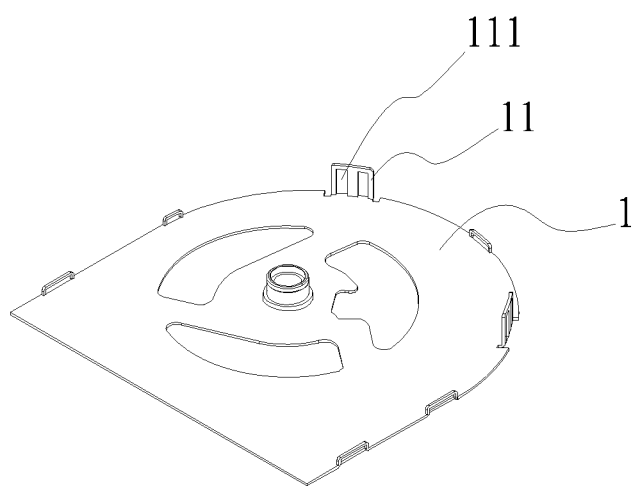

The present invention will now be described with some preferred embodiments thereof and by referring to the accompanying drawings. For the purpose of easy to understand, elements that are the same in the preferred embodiments are denoted by the same reference numerals.

Figure 2:
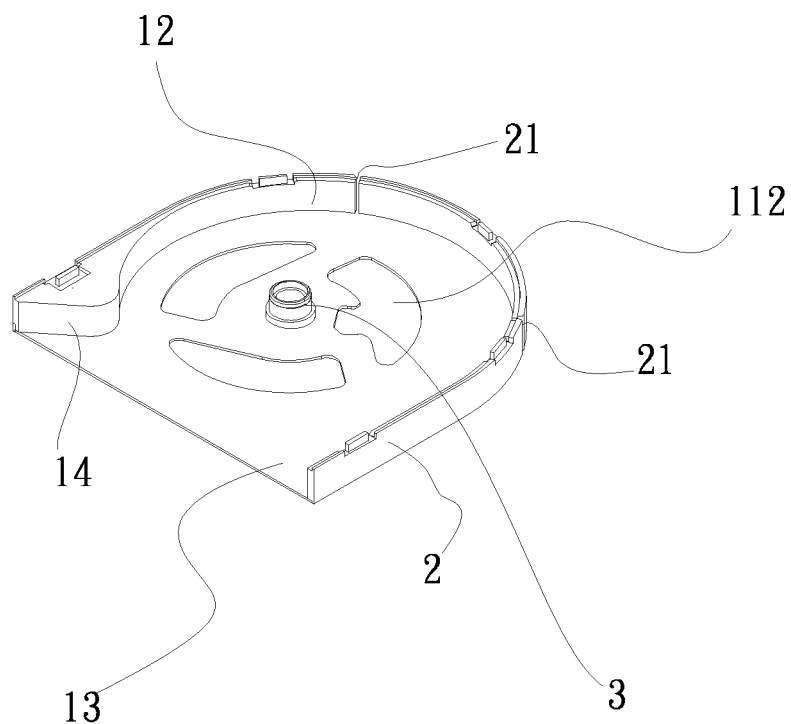
FIG. 2 is an assembled view of the fan frame structure of FIG. 1.

Please refer to FIGS. 1 and 2, which are exploded and assembled perspective views, respectively, of a fan frame structure according to a preferred embodiment of the present invention. As shown, in the preferred embodiment, the fan frame structure includes a base portion 1 and a wall portion 2.

The base portion 1 is a thin plate made of a metal material, and includes at least one extension section 11 vertically extended from an outer peripheral edge of the base portion 1. In the illustrated preferred embodiment, there are two extension sections 11. Every extension section 11 has connecting sides located at a left edge 11a and a right edge 11b thereof. The extension sections 11 are formed through stamping or bending and are respectively formed with at least two through holes 111 or ribs.

The wall portion 2 is formed along the outer peripheral edge of the base portion 1 through insert molding or injection molding and includes a plurality of wall segments 2a. The wall segments 2a are respectively connected to the left edge 11a and the right edge 11b of the extension sections 11 while a clearance 21 is reserved between two adjacent wall segments 2a. When forming the wall portion 2 through insert molding, a molding material of the wall portion 2 also wraps and fills up the through holes 111 on the extension sections 11. When the insert molding wall portion 2 is cooled and cured with the molding material filled up the through holes 111, the wall portion 2 can be associated with the extension sections 11 and the base portion 1 more securely and stably.

A shaft barrel 3 is provided at a central area of the base portion 1 through insert molding. A plurality of openings 112 is formed on the base portion 1 around the shaft barrel 3. The wall portion 2 extends along the outer peripheral edge of the base portion 1, such that the wall portion 2 and the base portion 1 together define a space 12 and an air outlet 13 between them. Further, the wall portion 2 includes a tongue section 14 located in the vicinity of the air outlet 13.

Figure 3:
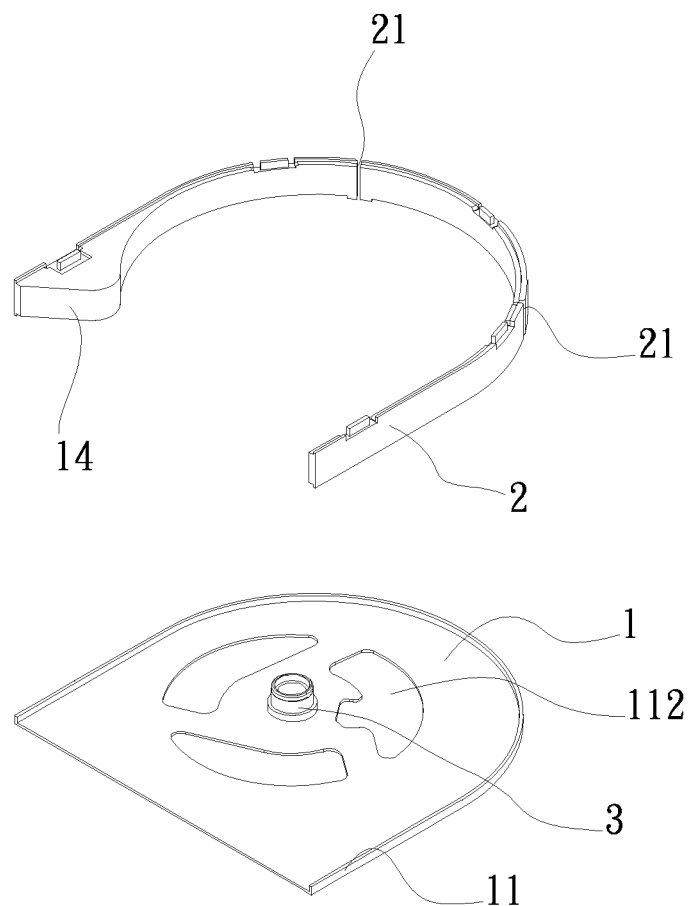
FIG. 3 is an exploded perspective view of a fan frame structure according to another embodiment of the present invention

As having been described above, the extension sections 11 are extended upward from the outer peripheral edge of the base portion 1 and can be formed by stamping or bending. In the preferred embodiment of FIG. 1, there are a plurality of extension sections 11 spaced from one another. In another operable embodiment, as shown in FIG. 3, there can be only one extension section 11, which continuously extends along the whole outer peripheral edge of the base portion 1. The continuous extension section 11 and the wall portion 2 are associated with each other in the insert molding process, so that the base portion 1 can have an enhanced structural strength to avoid deformation of the base portion 1.

The main object of the present invention is to provide a fan frame structure, of which the wall portion 2 is associated with the base portion 1 through insert molding, and a clearance 21 or a notch can be reserved between the wall segments 2a, i.e. the wall segments 2a are discontinuously formed, so that the clearance 21 provides a sufficient expansion allowance for the wall portion 2 and accordingly prevents the molded and expanded wall portion 2 from pressing against and deforming the base portion 1.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A fan frame structure, comprising:
    a base portion having at least one extension section vertically extended from an outer peripheral edge of the base portion; and the at least one extension section having connecting sides provided thereon; and
    a wall portion being integrally formed along the outer peripheral edge of the base portion through insert molding and including a plurality of wall segments; and each of the plurality of wall segments being connected to the connecting sides of the at least one extension section, and a clearance of narrow slit shape formed between an outer edge of one wall segment and an opposite outer edge of an adjacent wall segment to fully cut a connection between the outer edge and the opposite outer edge of the two adjacent wall segments, the clearance providing sufficient expansion allowance for the plurality of wall segments and preventing any expansion of the insert molded wall portion to press against the base portion and deform the base portion.

2. The fan frame structure as claimed in claim 1, wherein the at least one extension section is formed through stamping or bending.

3. The fan frame structure as claimed in claim 1, wherein the at least one extension section is provided with at least one through hole, and a molding material of the wall portion also filling up the through hole, so that the wall portion is also associated with the at least one extension section during said insert molding process.

4. The fan frame structure as claimed in claim 1, wherein the base portion is made of a metal material.

5. The fan frame structure as claimed in claim 1, wherein the at least one extension section comprises a plurality of extension sections, and the plurality of extension sections being spaced along the outer peripheral edge of the base portion.

6. The fan frame structure as claimed in claim 1, wherein the at least one extension section comprises only one extension section, and the one extension section continuously extending along the outer peripheral edge of the base portion.

7. The fan frame structure as claimed in claim 1, wherein the connecting sides of the at least one extension section are located at a left edge and a right edge thereof.

8. A fan frame structure, comprising:
    a base portion having at least one extension section vertically extended from an outer peripheral edge of the base portion; and the at least one extension section having connecting sides provided thereon; and
    a wall portion being integrally formed along the outer peripheral edge of the base portion through insert molding and including a plurality of wall segments; the plurality of wall segments being connected to the connecting sides of the at least one extension section, and a recess formed between two adjacent wall segments of the plurality of wall segments and indented from an outer side of the two adjacent wall segments to an inner side of the two adjacent wall segments such that the recess provides sufficient expansion allowance for the wall segments and prevents any expansion of the insert molded wall portion to press against the base portion and deform the base portion.

\* \* \* \* \*